United States Patent [19]

Bronner et al.

[11] Patent Number: 5,300,800

[45] Date of Patent: Apr. 5, 1994

[54] LOW LEAKAGE SUBSTRATE PLATE DRAM CELL

[75] Inventors: Gary B. Bronner, Mount Kisco; Sang H. Dhong, Mahopac; Wei Hwang, Armonk, all of N.Y.

[73] Assignee: International Business Machines Corporation, Armonk, N.Y.

[21] Appl. No.: 966,893

[22] Filed: Oct. 26, 1992

Related U.S. Application Data

[63] Continuation of Ser. No. 696,691, May 7, 1991, abandoned.

[51] Int. Cl.[5] ............... H01L 29/68; H01L 29/78; H01L 29/92
[52] U.S. Cl. .................... 257/304; 257/301; 257/305
[58] Field of Search ............... 357/23.6; 257/301, 304, 257/305, 397

[56] References Cited

U.S. PATENT DOCUMENTS

| | | |
|---|---|---|
| 4,523,213 | 6/1985 | Konaka et al. |
| 4,688,063 | 8/1987 | Lu et al. ........................ 357/23.6 |
| 4,792,834 | 12/1988 | Uchida ........................ 357/23.6 |
| 4,849,371 | 7/1989 | Hansen et al. ................ 436/82 |
| 4,967,248 | 10/1990 | Shimizu ....................... 257/304 |

FOREIGN PATENT DOCUMENTS 3543937  6/1956  Fed. Rep. of Germany ..... 357/23.6

OTHER PUBLICATIONS

Davari, B., et al., "A Variable-Size Shallow Trench Isolation (STI) Technology with Diffused Sidewall Doping for Submicron CMOS", *IEDM Tehcnical Digest*, 92 (1988).

Bronner, G. B., et al., "Epitaxy Over Trench Technology for ULSI DRAMs", 1988 Symposium on VLSI Technology, p. 21 (May 10-13, 1988).

Cottrell, P., et al., "N-Well Design for Trench DRAM Arrays", *IEDM Technical Digest*, 584 (1988).

Nobel, W. P., et al., "Parasitic Leakage in DRAM Trench Storage Capacitor Vertical Gated Diodes", *IEDM Technical Digest*, 340 (1987).

Lu, N., et al., "The SPT Cell-A New Substrate-Plate Trench Cell for DRAMs", *IEDM Technical Digest*, 771 (1985).

*Primary Examiner*—Ngan Ngo
*Assistant Examiner*—Stephen D. Meyer
*Attorney, Agent, or Firm*—Scully, Scott, Murphy & Presser

[57] ABSTRACT

Disclosed is a Dynamic Random Access Memory (DRAM) cell which includes a storage capacitor disposed in a trench formed in a semiconductor substrate and an access transistor disposed in a well which is opposite in conductivity type to that of the substrate and a buried oxide collar which surrounds an upper portion of the trench.

20 Claims, 4 Drawing Sheets

LOW LEAKAGE SUBSTRATE PLATE DRAM CELL

This is a continuation of copending application Ser. No. 696,691 filed on May 7, 1991 abandoned.

BACKGROUND OF THE INVENTION

1. Field of the Invention

This invention relates generally to a semiconductor memory device and, more particularly, to a Dynamic Random Access Memory (DRAM) cell having a trench storage capacitor wherein the retention time of the cell is significantly increased and leakage currents are eliminated by utilizing a buried oxide collar surrounding the trench.

2. Description of the Prior Art

There are many DRAM applications where it is important to maximize the retention time of the cell. In particular, applications depending on battery power for the system would benefit from a DRAM cell which did not need to be refreshed very often. Very Large Scale Integrated (VLSI) DRAM cells in the time frame of 4Mbit and beyond require trench storage capacitors in order to meet high density requirements. DRAM cells having a storage capacitor disposed in a trench formed in a semiconductor substrate are known in the art. For example, U.S. Pat. No. 4,688,063 assigned to the same assignee as the present invention, which patent is hereby incorporated by reference, discloses a substrate plate trench (SPT) DRAM cell which utilizes a trench storage capacitor formed in a semiconductor substrate. A portion of the substrate is heavily doped and forms the counterelectrode of the storage capacitor while a heavily doped polycrystalline plug disposed in the trench forms the other electrode of the storage capacitor. The SPT DRAM cell includes a field effect access transistor disposed in a well which is opposite in conductivity type to that of the substrate. The trench capacitor extends from the surface of the well, through the well and lightly doped substrate portion, into the heavily doped portion of the substrate. The capacitor electrode disposed in the trench is directly connected to the source/drain of the access transistor.

In the SPT DRAM cell of U.S. Pat. No. 4,688,063, charge is stored on the dielectrically isolated polysilicon electrode formed within the trench in order to meet rigid leakage requirements. To further reduce leakage, the DRAM cell includes an n-well interposed between the substrate plate and the access transistor electrodes. As described in Cottrell et al., "N-Well Design for Trench DRAM Arrays", *IEDM Tech. Digest*, pp. 584–587, 1988, to further increase the immunity of an SPT DRAM cell to leakage current an n-well with a doping profile that monotonically decreases with depth can be utilized.

While leakage is significantly reduced in prior art SPT DRAM cells, a parasitic voltage dependent upon junction leakage current may inherently develop in the memory devices which limit the retention time of the cell. This leakage current is the result of two main leakage mechanisms, (1) generation of charge carriers in the space charge region of the trench electrode diffusion and (2) thermal generation of charge carriers along the depleted sidewall of the trench. The second mechanism is aggravated by the n-well which sets up an electric field that causes the generated carriers to be collected by the trench electrode diffusion. As described in Noble et al., "Parasitic Leakage in DRAM Trench Storage Capacitor Vertical Gated Diodes", *IEDM Tech. Digest*, pp. 340–343, 1987, another disadvantage of the SPT DRAM cell is that when a bias is applied to the trench, the gating action of the trench also affects the n-well/substrate junction which leads to an excess current from the n-well to the substrate. Thus, there is a need to develop an SPT DRAM cell which minimizes the inherent junction leakage current.

SUMMARY OF THE INVENTION

The present invention is directed to an SPT DRAM cell with a buried oxide collar surrounding an upper portion of the trench which significantly increases the retention time of the cell and minimizes leakage currents. Similar to a conventional SPT DRAM cell, the present SPT DRAM cell includes a field effect access transistor and a storage capacitor both of which are formed in a well in a semiconductor substrate. The well is of opposite conductivity type to that of the substrate. Also included is a trench which extends from the surface of the well, through the well and a lightly doped portion of the substrate, into a heavily doped portion of the substrate which acts as the counterelectrode of the storage capacitor. A heavily doped polycrystalline plug disposed in the trench forms the other electrode of the storage capacitor. The trench electrode is directly connected to the source/drain of the access transistor by means of a bridge region. Unlike a conventional SPT DRAM cell, the present SPT DRAM cell includes a buried oxide collar that surrounds an upper portion of the trench and extends from the source/drain region of the access transistor through the well and into the lightly doped portion of the substrate.

The oxide collar prevents the sidewalls of the trench from depleting. In addition, the collar eliminates the gating action of the trench on both the p+/n-well junction and the n-well/substrate junction. With the node diffusion now on the buried oxide layer, the only depleted region occurs laterally away from the buried collar. This minimizes excess leakage current due to generation of carriers along the depleted trench sidewalls. Thus, the buried oxide layer allows refresh intervals to be lengthened and reduces the well current, thereby lowering the standby power of the chip.

A technique for fabricating the structure of the DRAM cell of the present invention is also disclosed. The process for fabricating the present SPT DRAM cell is compatible with conventional SPT processing. The starting substrate is a p−/p+ epitaxially grown wafer. Compared to a conventional process the p− layer will be thinner by an amount equal to the epitaxial layer thickness subsequently grown. A region of thick oxide is formed in the substrate using a shallow trench isolation process. This layer will be slightly larger than the deep trench so that it will completely surround the trench. The oxide layer is then buried using conventional epitaxial overgrowth technology. Next, a nitride/oxide stack is formed and patterned using a trench mask. Trenches are dug down to and through the buried oxide layer. The trenches are lined and filled with p+ polysilicon and then planarized using the nitride layer as a planarization stop. From this point the conventional process can be followed to arrive at the final SPT DRAM cell of the present invention.

BRIEF DESCRIPTION OF THE DRAWINGS

FIG. 4 shows the buried oxide collar surrounding an upper portion of a trench which penetrates through a well and a lightly doped portion of a semiconductor substrate into a heavily doped portion of the substrate.

DETAILED DESCRIPTION OF THE INVENTION

Figure 1:
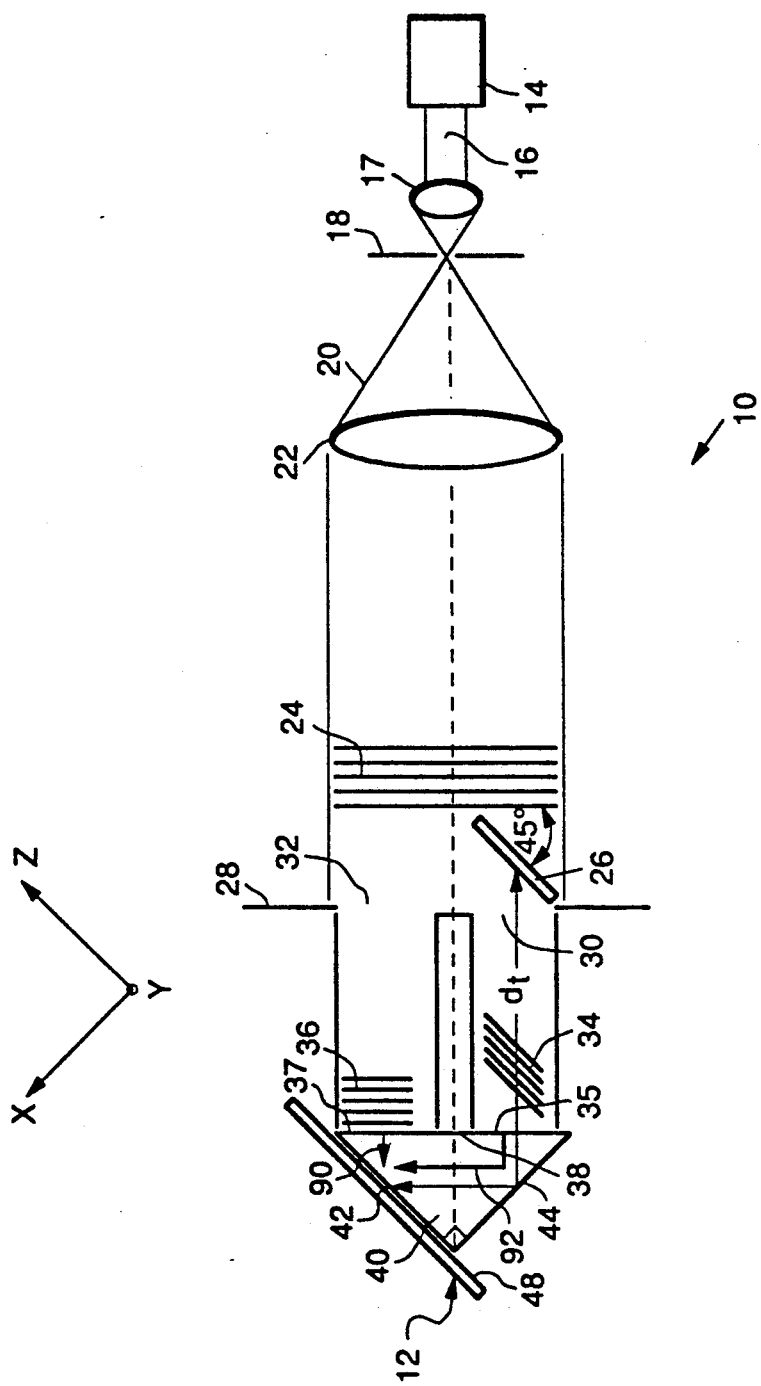
FIG. 1 is a cross-sectional view of an SPT DRAM cell which utilizes a buried oxide collar surrounding an upper portion of the trench capacitor in accordance with the present invention.

Referring to FIG. 1, there is shown a cross-sectional view of a Dynamic Random Access Memory (DRAM) cell 10 which includes a field effect transistor 12 and a trench capacitor 14 both of which are formed in a semiconductor substrate 16. Transistor 12 is formed in an n-well 18 and includes source region 20 and drain region 22 of heavily doped p+-conductivity type. N-well 18 is disposed in a lightly doped p−-conductivity type portion 24 of substrate 16. Recessed oxide (ROX) regions 26 isolate memory cell 10 from other similar memory cells formed on substrate 16.

In FIG. 1, trench capacitor 14 is formed in a trench 28 which extends from the surface of substrate 16 through n-well 18 and lightly doped substrate portion 24 into a heavily doped p+-conductivity type portion 30 of substrate 16. A plug 32 of heavily doped p+-conductivity type polycrystalline silicon is disposed in trench 28 and insulated from substrate 16 by means of a layer 34 of insulating material. Layer 34 may be a single layer of silicon dioxide or preferably may be a composite triple layer made up of layers of silicon dioxide, silicon nitride and silicon dioxide. A buried oxide collar 36 surrounds an upper portion of trench 28 and extends from source region 20 and ROX region 26 through n-well 18 into lightly doped portion 24 of substrate 16. The buried oxide collar 36 is composed of an electrically insulating material, such as silicon dioxide. Source region 20 and plug 32 are electrically and physically interconnected by means of a bridge region 38 of heavily doped p+-conductivity type polycrystalline silicon. A gate electrode 40 of heavily doped n+-conductivity polycrystalline silicon is shown disposed over and insulated from the channel region between source region 20 and drain region 22 by a thin gate oxide 42. Gate electrode 40 is connected via interconnection 44 to other gate electrodes of an array of DRAM cells 10 to form word lines. Drain region 22 is connected to other DRAM cell drains via metal interconnection layer 46 to form bit lines. Layer 48 insulates trench capacitor 14, source 20 and gate electrode 40 from metal interconnection layer 46. Layer 48 may be silicon dioxide or preferably boro-phospho silicate glass (BPSG).

Figure 2:
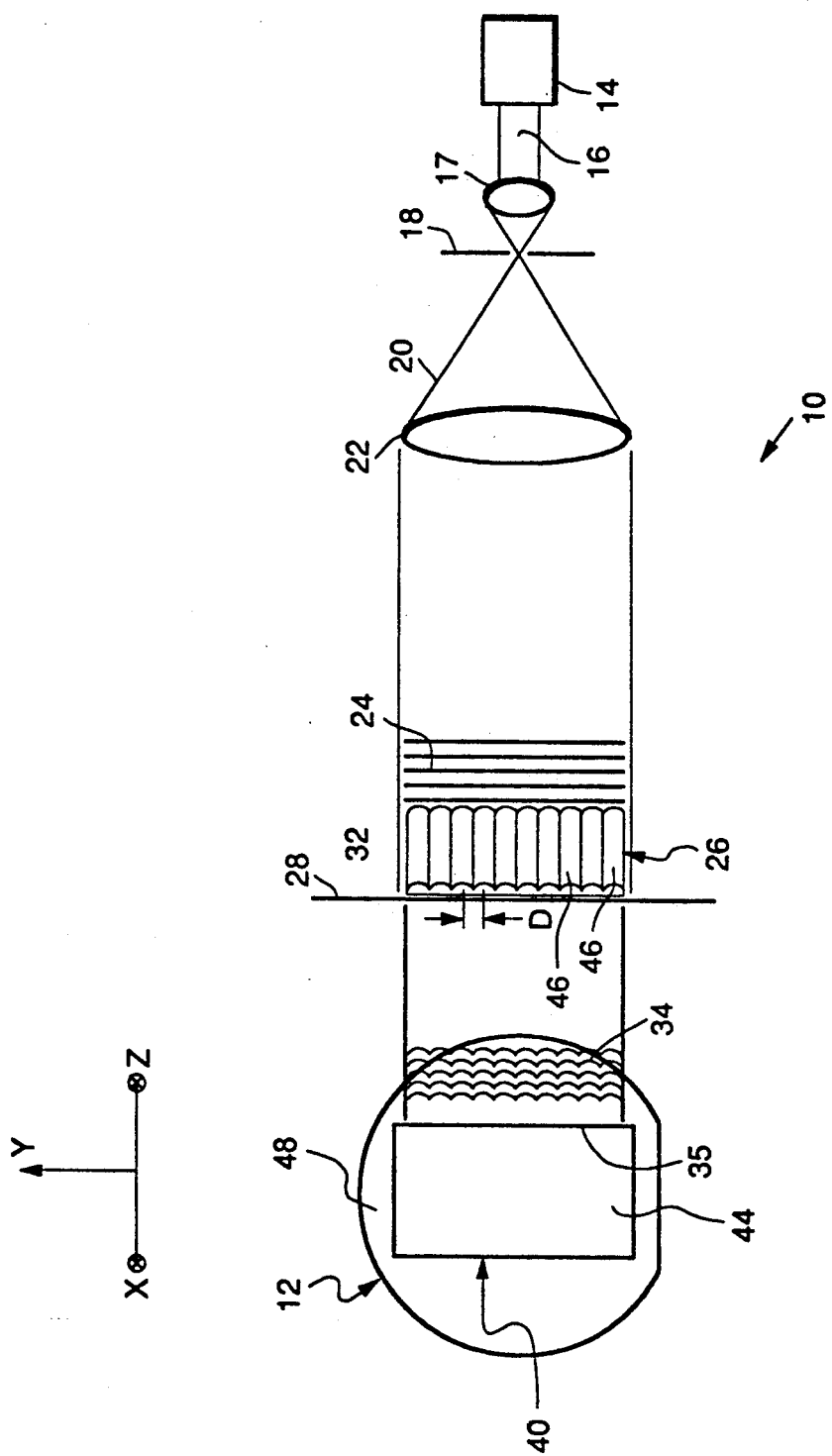
FIG. 2 is a partial plan view of the SPT DRAM cell of FIG. 1 showing the relationship of the buried oxide collar to the trench capacitor.

Referring now to FIG. 2, there is shown a plan view of DRAM cell 10. In the layout drawing of FIG. 2, both the relationship of trench capacitor 14 to buried oxide layer 36 and the relationship of DRAM cell 10 to an adjacent similar DRAM cell 10' are shown.

Figure 3:
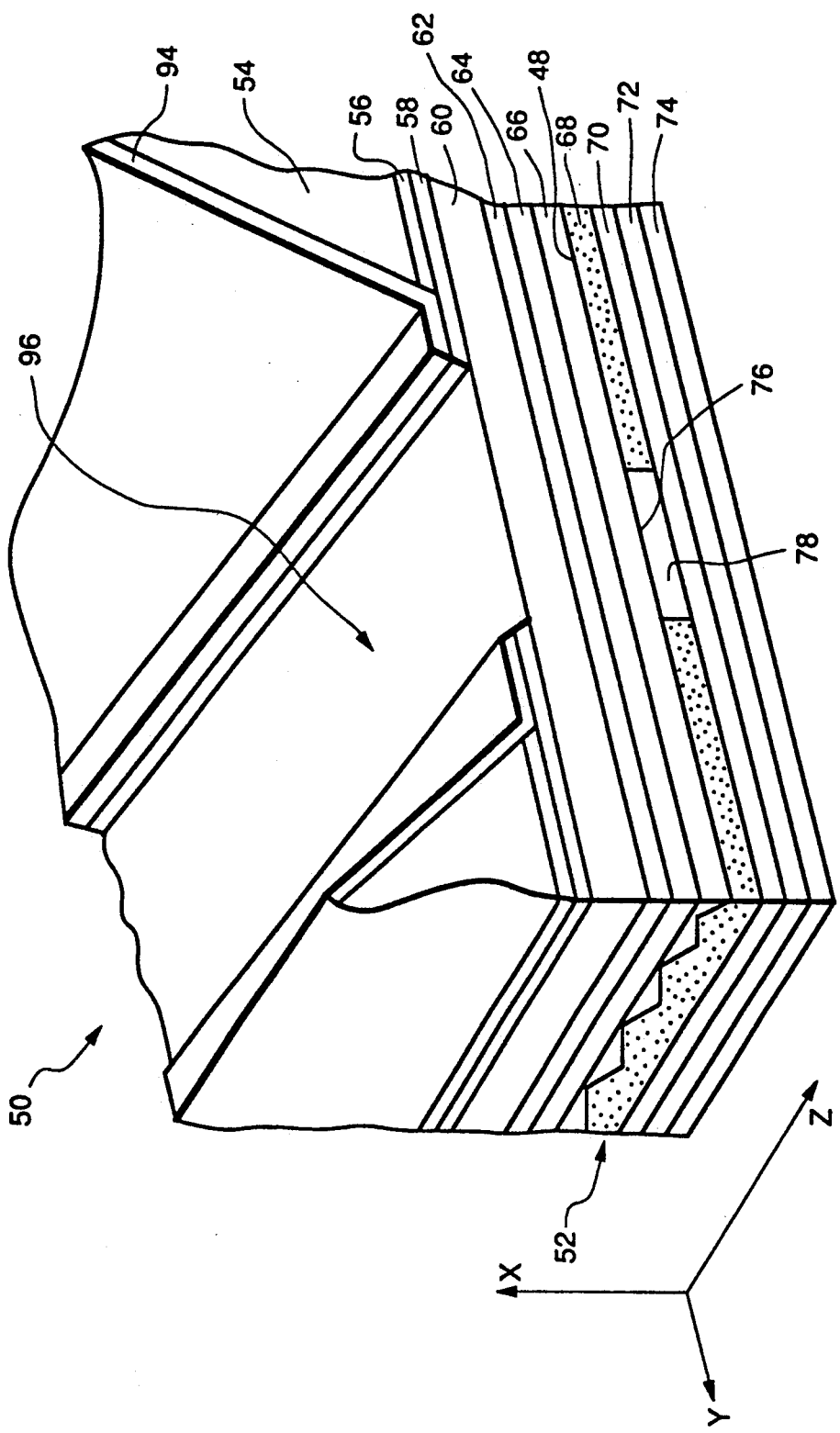
FIG. 3 is a cross-sectional view of the structure of FIG. 1 at an intermediate stage of fabrication showing the buried oxide layer.

A method for fabricating the SPT DRAM cell 10 of the present invention will now be described below. The process for fabricating the SPT DRAM cell 10 is compatible with conventional SPT processing. Referring now to FIG. 3, there is shown a cross-sectional view of the DRAM cell of FIG. 1 at an intermediate stage in its fabrication process after the formation of the thick oxide layer. The fabrication of DRAM cell 10 is begun by starting with a substrate 16 having a lightly doped substrate portion 50 of a p−-conductivity type and a heavily doped p+-conductivity type portion 30. Compared to a conventional process, the p−-conductivity portion 50 will be thinner by an amount equal to the thickness of the epitaxial layer grown subsequently.

A modification of the shallow trench isolation process described in Davari et al., "A Variable-Size Shallow Trench Isolation (STI) Technology with Diffused Sidewall Doping for Submicron Technology CMOS", *IEDM Tech. Digest*, pp. 92–95, 1988, which article is hereby incorporated by reference, is used to form oxide layer 36. The first step is to deposit a nitride/pad oxide stack and then pattern it. Next, a shallow trench is formed by reactive ion etching (RIE) and an oxide is deposited by chemical vapor deposition (CVD). Lastly, the CVD oxide and nitride/pad oxide stack are etched back and the surface planarized such that the surface of oxide layer 36 and the surface of layer 50 are coplanar. This layer 36 will be slightly larger than the trench used to form the trench capacitor so that it will completely surround the trench. Next, the oxide layer 36 is buried using selective epitaxial overgrowth technology described in Bronner et al., "Epitaxy Over Trench Technology for VLSI DRAMs", *VLSI Technology Symposium*, pp. 21–22, May 1988, which article is hereby incorporated by reference, to form layer 52 of p−-conductivity type.

Figure 4:
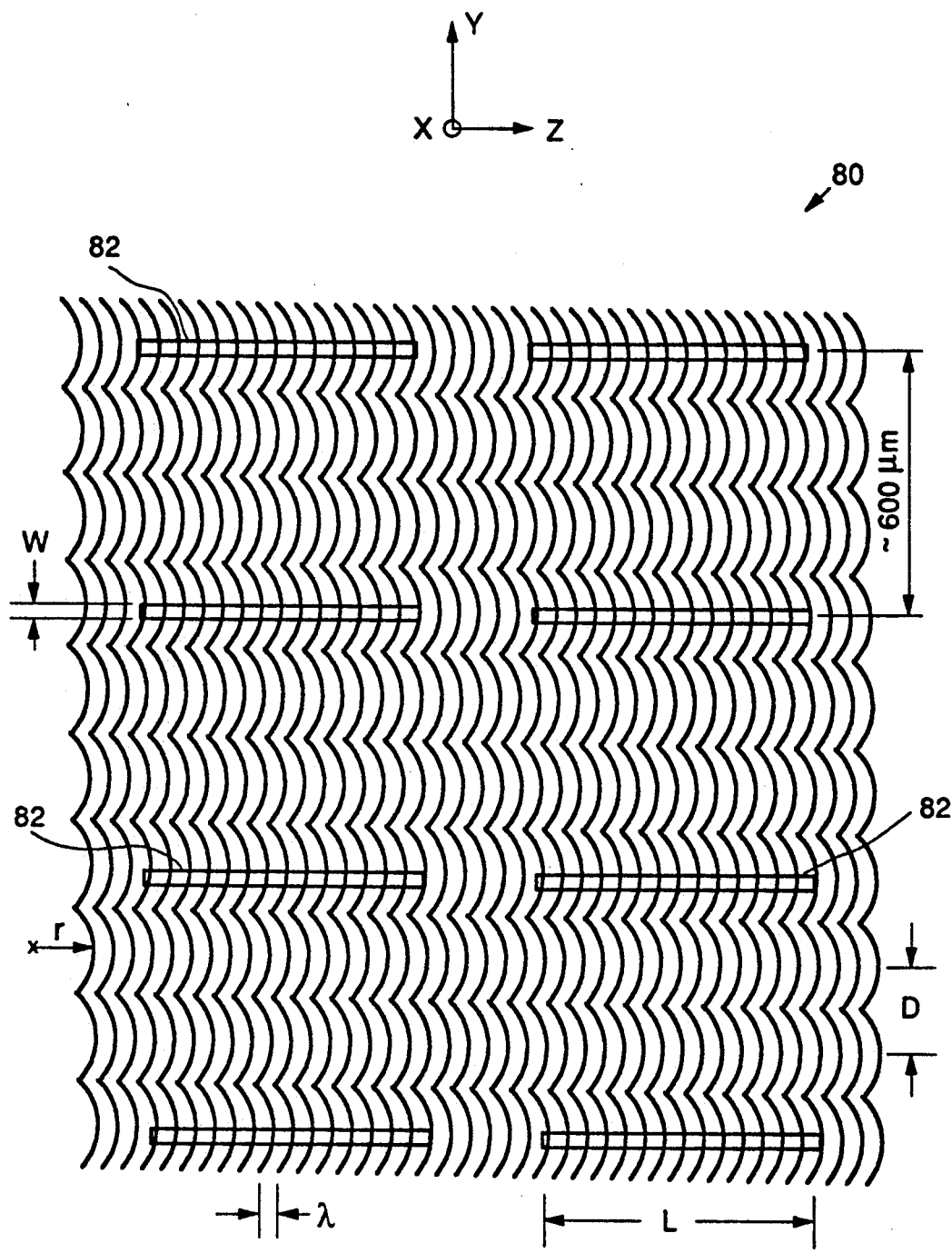
FIG. 4 is a cross-sectional view of the structure of FIG. 1 at a later stage of fabrication.
Figure 1:
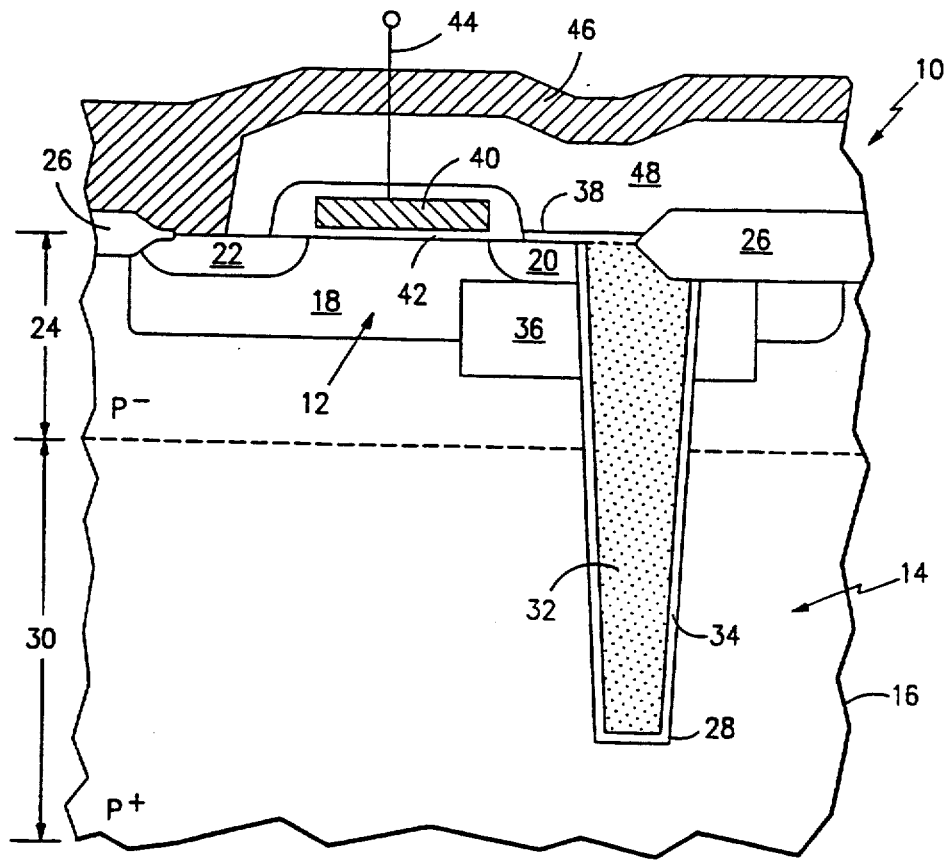
Figure 2:
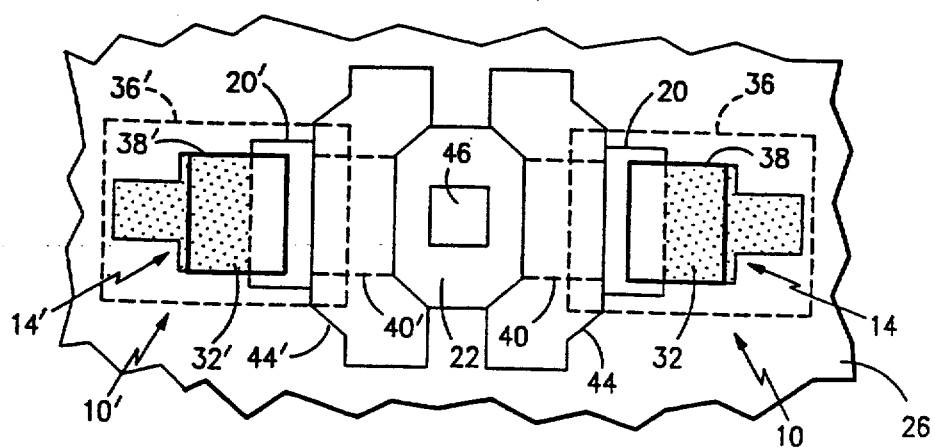
Figure 3:
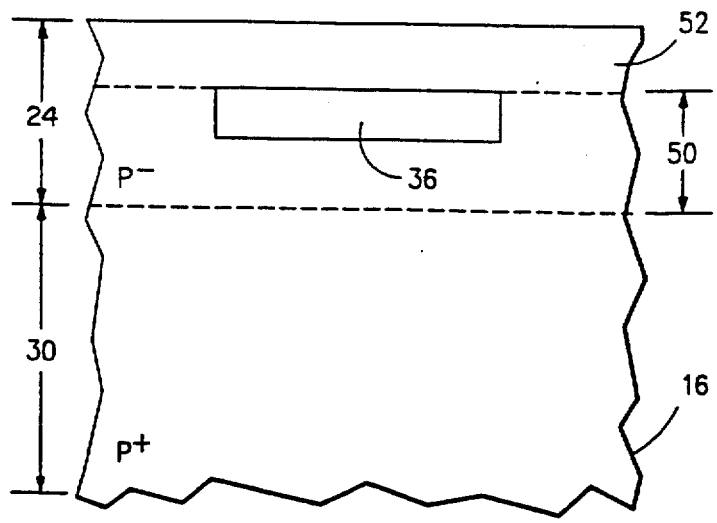
Figure 4:
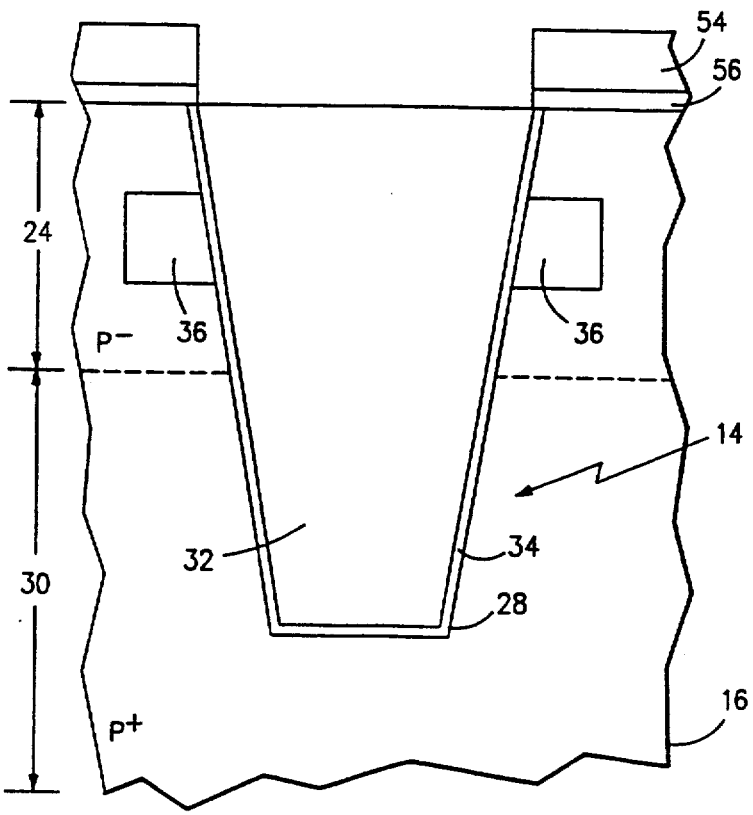

Referring now to FIG. 4, there is shown a cross-sectional view of the DRAM cell 10 of FIG. 1 at another intermediate stage in its fabrication process after the formation of trench region 28. The structure of FIG. 4 is obtained by first depositing a nitride 54/oxide 56 stack and patterning it over the substrate using a trench mask by well known techniques. Substrate 16 is then subjected to RIE whereby the unmasked portion of substrate 16 is removed down to a desired depth. The trench 28 is dug down to and through buried oxide layer 36. Next layer 34 is formed on the surface of trench 28. Layer 34 may be a single layer of silicon dioxide or preferably may be a composite triple layer made up of layers of silicon dioxide, silicon nitride and silicon dioxide. To form the triple layer, a first oxide layer is thermally grown which forms only on the surface of trench 28 since a nitride layer still masks the surface of substrate 16. Subsequently, a layer of nitride is deposited everywhere by chemical vapor deposition on the surface of the thermally grown oxide. Then, substrate 16 is subjected to a thermal oxidation step which forms a thermally grown oxide in any pinholes which might be present in the previously deposited nitride layer.

A layer of heavily doped polycrystalline silicon is then deposited using the chemical vapor deposition of silicon from silane doped with boron to render the resulting layer =p+-conductivity type. The layer 32 is deposited in a thickness sufficient to fill trench 28. Substrate 16 is then subjected to an RIE planarization step to remove the polycrystalline layer everywhere down to the top of trench 28. The nitride layer deposited during the formation of trench insulation layer 34 and the nitride layer 54 act as etch stops during the RIE planarization step. At this point, DRAM cell 10 has the structure shown in cross-section in FIG. 4.

The structure in FIG. 4 is now equivalent to a standard SPT cell process after trench poly fill and planarization. From this point, the conventional SPT cell process is followed to complete the structure of FIG. 1. In the conventional process, ions are implanted to form n-well 18. Next, ROX regions 26 are formed by thermal oxidation and isolates DRAM cell 10 electrically from other similar cells formed on substrate 16. Then, bridge region 38 and access transistor 12 is formed having a source region 20, drain region 22 and gate 40. Next, BPSG is deposited and reflowed to form layer 48. Lastly, contacts are open, and M1 metallization is deposited and patterned to form bitline metal interconnection layer 46. Layer 46 may be aluminum or tungsten.

It will be understood by those skilled in the art of the present invention that while only a single SPT DRAM cell 10 has been shown in FIG. 1, a plurality of SPT DRAM cells 10 are normally formed in n-well 18 and fabricated simultaneously therein in the same manner as described hereinabove. It will also be understood that, while an n-well 18 has been shown in FIG. 1, a p-well may just as easily be used. Then, of course, the conductivity types of source 20 and drains 22 and substrate portions 24 and 30 should be changed to n-conductivity type.

While the invention has been particularly shown and described with respect to illustrative and preferred embodiments thereof, it will be understood by those skilled in the art that the foregoing and other changes in form and details may be made therein without departing from the spirit and scope of the invention which should be limited only by the scope of the appended claims.

We claim:

1. A dynamic random access memory cell comprising:
   a substrate of a first conductivity type an upper portion of which is less conductive than a highly conductive lower portion,
   a region disposed in said upper portion of said substrate having a conductivity type opposite to that of said substrate,
   at least one access device having first and second diffusion regions disposed in said region,
   at least one storage means extending from the surface of said region through said region and said upper portion into said highly conductive lower portion of said substrate, said storage means being electrically isolated from said region and said upper and lower portions of said substrate by an insulating layer; and
   a buried insulating collar disposed beneath the surface of said region, surrounding an upper portion of said at least one storage means and extending from said region through said region and into said upper portion of said substrate, a portion of said insulating collar being disposed below said first diffusion region and in a vertical path extending from said first diffusion region to said upper portion of said substrate, said insulating collar being contiguous with said insulating layer on all sides.

2. A dynamic random access memory cell according to claim 1 wherein said buried insulating collar is contiguous with said first diffusion region.

3. A dynamic random access memory cell according to claim 1 further including means for interconnecting said at least one access device and said at least one storage means.

4. A dynamic random access memory cell according to claim 1 wherein said substrate is made of semiconductor material at least a portion of which is heavily doped.

5. A dynamic random access memory cell according to claim 4 wherein said semiconductor material is silicon of n-conductivity or p-conductivity type.

6. A dynamic random access memory cell according to claim 1 wherein said region is a region of semiconductor material.

7. A dynamic random access memory cell according to claim 6 wherein said semiconductor material is silicon of p-conductivity or n-conductivity type.

8. A dynamic random access memory cell according to claim 1 wherein said at least one access device is a field effect transistor.

9. A dynamic random access memory cell according to claim 1 wherein said at least one storage means is an electrode disposed in an insulating spaced relationship with said substrate.

10. A dynamic random access memory cell according to claim 9 wherein said electrode is comprised of heavily doped polycrystalline silicon.

11. A dynamic random access memory cell according to claim 1 wherein said substrate includes a heavily doped lower portion and a lightly doped upper portion disposed over said heavily doped lower portion.

12. A dynamic random access memory cell according to claim 11 wherein said region is disposed in said lightly doped upper portion of said substrate.

13. A dynamic random access memory cell comprising:
    a semiconductor substrate having a lightly doped portion of one conductivity type overlying a heavily doped portion of the same conductivity type,
    a region of second conductivity type disposed in said lightly doped portion,
    at least one access transistor having first and second diffusion regions disposed in said region,
    at least one trench extending from the surface of said region through said region and said lightly doped portion into said heavily doped portion,
    at least one storage electrode disposed in said at least one trench and being insulated from said region and said substrate by an insulating layer, and
    a buried insulating collar disposed beneath the surface of said region, surrounding an upper portion of said trench and extending from said region through said region and into said lightly doped portion of said substrate, a portion of said insulating collar being disposed below said first diffusion region and in a vertical path extending from said first diffusion region to said upper portion of said substrate, said insulating collar being contiguous with said insulating layer on all sides.

14. A dynamic random access memory cell according to claim 13 wherein said buried insulating collar is contiguous with said first diffusion region.

15. A dynamic random access memory cell according to claim 13 further including means for interconnecting said at least one storage electrode and said at least one access transistor.

16. A dynamic random access memory cell according to claim 15 wherein said buried insulating collar is silicon dioxide.

17. A dynamic random access memory cell according to claim 16 wherein said at least one access transistor is a field effect transistor.

18. A dynamic random access memory cell according to claim 17 wherein said at least one storage electrode is made of heavily doped, polycrystalline semiconductor material.

19. A dynamic random access memory cell according to claim 18 wherein said means for interconnecting is a region of polycrystalline semiconductor material.

20. A dynamic random access memory cell according to claim 19 wherein said semiconductor material is silicon.

* * * * *

UNITED STATES PATENT AND TRADEMARK OFFICE
CERTIFICATE OF CORRECTION

PATENT NO. : 5,300,800  
DATED : April 5, 1994  
INVENTOR(S) : Gary B. Bronner, et al.

It is certified that error appears in the above-indentified patent and that said Letters Patent is hereby corrected as shown below:

On the Title Page, Section [56], line 6: "436/82" should read --437/82--

On the Title Page, Section [56], under "FOREIGN PATENT DOCUMENTS", after "357/23.6" insert the following:

-- 0167764    1/1986    EPO.....  
    0265616    5/1988    EPO.....  
    0283964    9/1988    EPO.....  
    63307775    12/1988    Japan...  
    2001967    1/1990    Japan... --

On the Title Page, delete drawing.

In the Drawings, delete Figures 1-4 (4 sheets) and replace with Figures 1-4 submitted on 12/6/93 (2 sheets) (copies attached)

Column 4, line 60: "=" should read --32--

Signed and Sealed this

Twenty-first Day of February, 1995

Attest:

BRUCE LEHMAN

Attesting Officer      Commissioner of Patents and Trademarks